United States Patent [19]
Hsu

[11] Patent Number: 5,342,214
[45] Date of Patent: Aug. 30, 1994

[54] IC SOCKET

[76] Inventor: Feng-Chien Hsu, 1st Fl., No. 121, Yun Ho St., Ta An Dist., Taipei, Taiwan

[21] Appl. No.: 146,585

[22] Filed: Nov. 1, 1993

[51] Int. Cl.5 .......................................... H01R 13/62
[52] U.S. Cl. .................................. 439/342; 439/259
[58] Field of Search ............... 439/342, 259, 261, 262, 439/263, 264, 265, 266, 268–270, 682, 842, 851–855

[56] References Cited

U.S. PATENT DOCUMENTS

| | | | |
|---|---|---|---|
| 4,744,768 | 5/1988 | Rios | 439/262 |
| 4,750,891 | 6/1988 | Egawa | 439/259 |
| 5,059,135 | 10/1991 | Matsuoka et al. | 439/268 |
| 5,254,012 | 10/1993 | Wang | 439/342 |

Primary Examiner—Larry I. Schwartz
Assistant Examiner—Hien D. Vu
Attorney, Agent, or Firm—Hedman, Gibson & Costigan

[57] ABSTRACT

An IC socket includes a cover slidably engaged to a base. The cover has a plurality of holes formed therethrough for receiving a corresponding number of IC pins. The base has a plurality of slots each of which corresponds to one of the holes of the cover and is retained in communication with the corresponding hole when the cover is slid on the base. A plurality of conductive plate device each of which is respectively positioned in a corresponding slot of the base. Each conductive plate device is substantially a fork including a left upper plate and a right upper plate, both intersected at a lower intersection portion of the conductive plate device. A shoulder extends substantially perpendicular to the intersection portion and bent downward as a lower plate. The right upper plate has a contact portion at the top thereof curved and extended in a direction to the left upper plate thus forming a guiding portion for guiding the IC pin to firmly contact the contact portion.

3 Claims, 6 Drawing Sheets

IC SOCKET

BACKGROUND OF THE INVENTION

1. Field of the Invention

The present invention relates to an IC socket, and more particularly to an improved IC socket which can increase the attachment effect between the IC pins and the socket holes thereof.

2. Description of the Prior Art

Some ICs such as central processing units (CPUs) are quite sensitive to temperature, thus they are apt to be damaged if exposed to high temperature for a period of time such as being directly soldered onto a printed circuit board. Therefore, it is common to provide an IC socket mating with the pins of the IC to replace the latter to be directly soldered on the printed circuit board, thus preventing the IC from being directly exposed to high temperature. FIG. 10 illustrates a conventional IC socket for the above purpose. The conventional IC socket comprises a cover 10 slidably engaged to a base 80. The cover 10 has a plurality of holes 11 formed therethrough for receiving a corresponding number of IC pins 31 which is formed in an IC 30. For clarification, the IC 30, the cover 10 and the base 80 are illustrated partially. The base 80 has a plurality of slots 81 so formed thereon that each one of them corresponds to one of the holes 11 of the cover 10 and is in communication with the corresponding hole 11. The slot 81 has a greater width than the diameter of the hole 11. The cover 10 is slidable on the base 80 for substantially a distance equaling to the width of the slot 81. When the cover 10 is slid on the base 20, each hole 11 thereof can be slid from a first end of a corresponding slot 81 to a second end of the same slot 81, with the pair of the hole 11 and slot 81 being retained in communication with each other.

Each slot 81 also penetrates the socket 80 through the bottom thereof, yet it is not shown in this figure. A conductive plate device 90 is received in each slot 81 for providing electrical contact between the IC pin 31 and the printed circuit board. The conductive plate device 90 has an upper plate 91 longitudinally curved downward and formed as a middle plate 92, which in turn bent downward to form a lower plate 95 which penetrates the bottom of the IC socket base 80 and is soldered on the printed circuit board. A curved plate 93 is extended laterally from the upper plate 91 and bent as a wing plate 94. Before inserting the IC into the socket, the cover 10 has to be in a first position where each of the holes 11 is in communication with a channel 89 formed between the upper plate 91 and a portion of the inner periphery of the slot 81. Subsequently, the IC 30 is inserted into the socket, with each pin 31 thereof being inserted into a corresponding one of the channels 89. However, this does not guarantee that each pin 31 of the IC 30 is electrically contacted to the conductive plate device 90 until the cover 10 is manually pulled in a lateral direction such that each pin 31 of the IC 30 is slid through the curved plate 93 and finally firmly positioned in a clamping area 84 which is defined between the wing plate 94 and an inner portion of the slot 81. Since the conductive plate device 90 is a curved structure, the slot has to include a minimum sectional area allowing the conductive plate device 90 to enter. However, the conductive plate means 90 is not firmly positioned in the slot 81 and is apt to move in the slot 81 when the corresponding pin 31 of the IC 30 is inserted into the slot 81 thus affecting (damaging) the soldering engagement between the socket and the printed circuit board. The bottom portion of the slot 81 has a width greater than the width (diameter) of the IC pin 31, therefore a portion of the slot 81 constitutes a passage for some gaseous soldering flue (when the socket 80 is being soldered on the printed circuit board, a portion of soldering flue is in gaseous state). Therefore, some conductive plate devices 90 are covered by the unrequited soldering flue and have poor electrical contact with the corresponding IC pins 31.

Moreover, a plurality of the conductive plate devices 90 are linked together to be a row before being inserted into the socket. It should be noted that each conductive plate device 90 has to be torn apart from the row before it is inserted into the socket. The wing plate 94 is apt to be deformed caused by improper tear. If the wing plate 94 is deformed, the corresponding pin 31 is not easily fixed between the clamping area 84.

The present invention has arisen to mitigate and/or obviate the afore-described disadvantages of the conventional IC socket.

SUMMARY OF THE INVENTION

The primary objective of the present invention is to provide an IC socket which has conductive plate means therein retained firm when inserted with an IC.

Another objective of the present invention is to provide an IC socket which prevents gaseous soldering flue from coating the upper portion of the conductive plate means.

In accordance with one aspect of the invention, there is provided an IC socket comprising a cover slidably engaged to a base. The cover has a plurality of holes formed therethrough for receiving a corresponding number of IC pins. The base has a plurality of slots each of which corresponds to one of the holes of the cover and is retained in communication with the corresponding hole when the cover is slid on the base. A plurality of conductive plate means each is respectively positioned in a corresponding slot of the base. Each conductive plate means is substantially a fork comprising a left upper plate and a right upper plate, both intersected at a lower intersection portion of the conductive plate means. A shoulder extends substantially perpendicular to the intersection portion and bent downward as a lower plate. The left upper plate and the right upper plate are not co-planer. The right upper plate has a contact portion at the top thereof curved and extended in a direction to the left upper plate thus forming a guiding portion. The left upper plate and the right upper plate are not co-planer, thus when the IC pin is originally inserted into the slot, the IC pin is positioned in loose contact with the left upper plate, after then, the IC pin is further manually pulled to firmly contact with the contact portion of the right upper plate. Each of the slots has two protrusions formed in two opposite inner peripheries thereof for abutting against two side portions of the intersection portion of the conductive plate means, thereby preventing the latter from moving in the slot. The two protrusions also block gaseous soldering flue from coating on the contact portion of the conductive plate means.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 1:
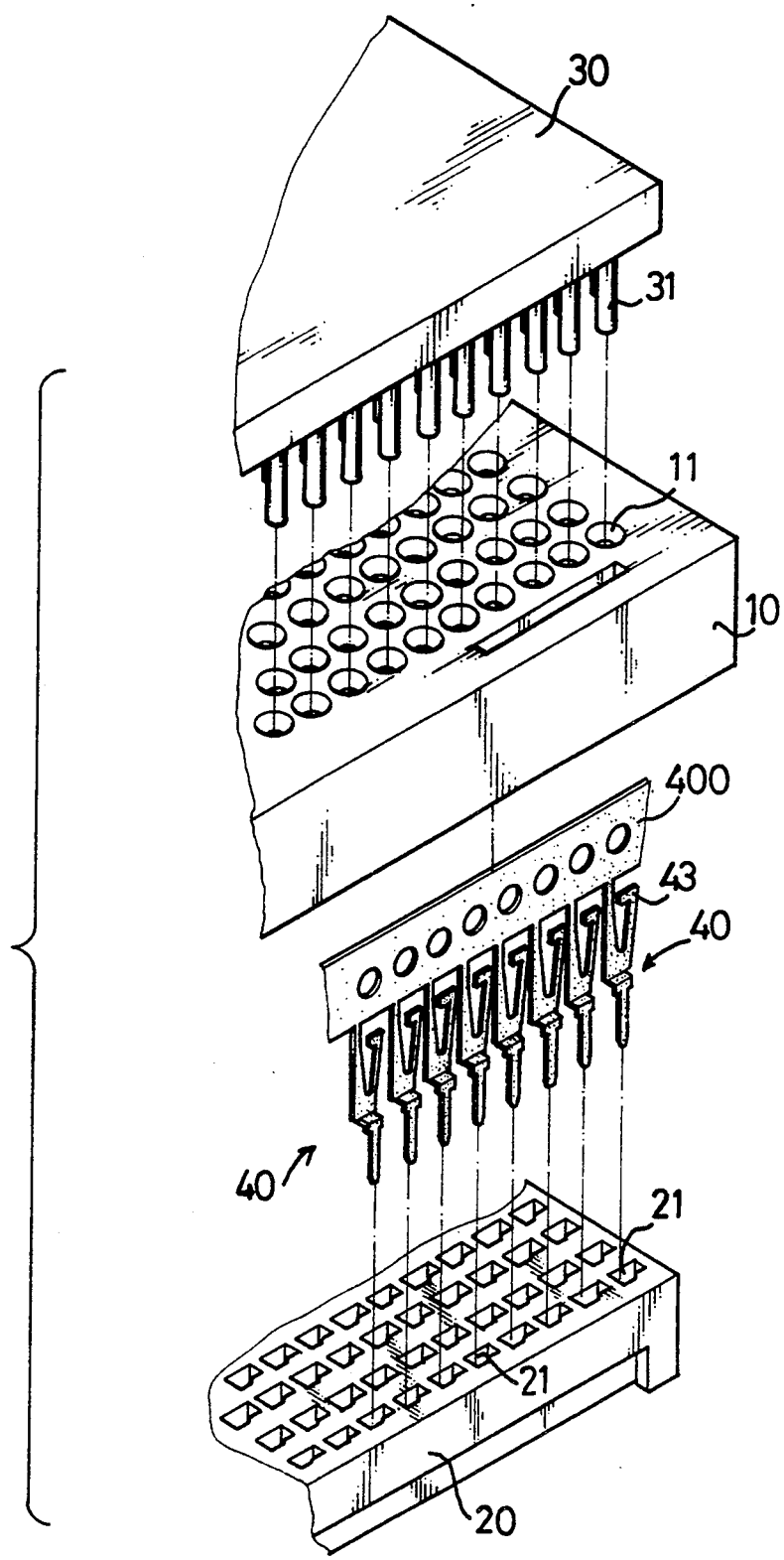
FIG. 1 is an exploded view of an IC socket in accordance with the present invention including a cover and a base which has a plurality of slots formed therethrough and each slot has a corresponding conductive plate means to be inserted therein and an additional IC being illustrated above the cover.

Referring to FIG. 1, an IC socket comprises a cover 10 and a base 20. The cover 10 has a plurality of holes 11 formed thereon exactly the same as the conventional one mentioned previously. For clarification, the IC 30, the cover 10 and the base 20 are illustrated partially. The base 20 has a plurality of slots 21 so formed thereon that each one of them corresponds to one of the holes 11 of the cover 10 and is retained in communication with the corresponding hole 11 when the cover 10 is slid on the base 20. The relation between each pair of the hole 11 and the slot 21 is the same as the conventional socket. A plurality of conductive plate means 40 are serially connected as a row by a linking plate 400. Each conductive plate means 40 is positioned in a corresponding slot 21 of the base 20. Firstly, a row of the conductive plate means 40 is inserted into a row of slots 21. Secondly, the linking plate 400 is manually torn apart from the row of conductive plate means 40.

Figure 2:
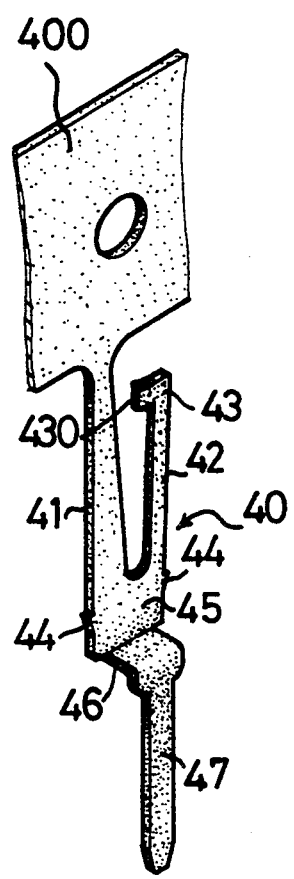
FIG. 2 is a perspective view of a conductive plate means which is to be positioned in a corresponding slot of the base.
Figure 3:
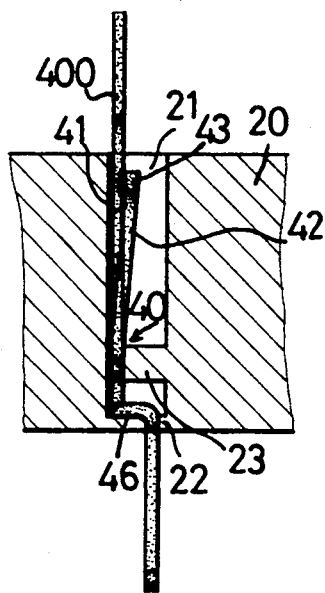
FIG. 3 is a cross-sectional view of a slot of the IC socket with a conductive plate means being positioned therein.
Figure 4:
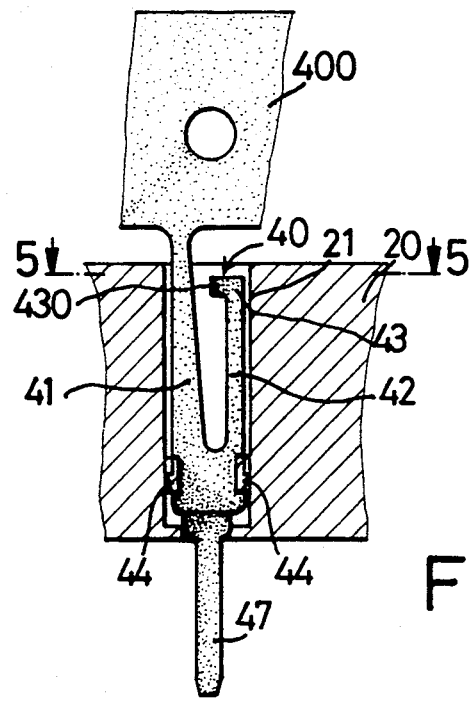
FIG. 4 is another cross-sectional view of a slot of the IC socket, with the conductive plate means being shown in another face compared to the one shown in FIG. 3.
Figure 5:
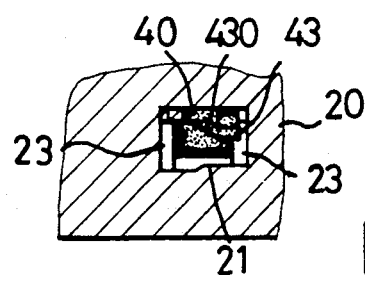
FIG. 5 is a top cross-sectional view of a slot of the socket taken from line 5—5 of FIG. 4, with the conductive plate means being positioned therein and blocking a portion of one of the protrusions.

Referring to FIG. 2, each conductive plate means 40 is substantially a fork comprising a left upper plate 41 and a right upper plate 42 both intersected at a lower intersection portion 45 thereof. A shoulder 46 extends substantially perpendicular to the intersection portion 45 of the two upper plates 41, 42 and is bent downward as a lower plate 47. The left upper plate 41 and the lower plate 47 are substantially parallel to each other, while the right upper plate 42 is not parallel to the plates 41 and 47. Actually, the left upper plate 41 and the right upper plate 42 are not in a same plane. The right upper plate 42 has a contact portion 43 at a top thereof curved and extended in a direction to the left upper plate 41 thus forming a guiding portion 430 as will be described in more detail later.

Figure 6:
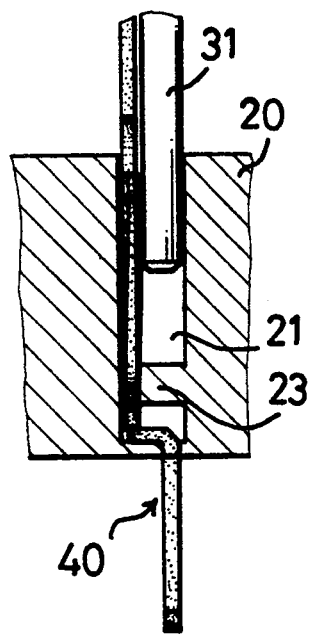
FIG. 6 is a cross-sectional view of the slot illustrating an IC pin being inserted into a slot of the IC socket.
Figure 7:
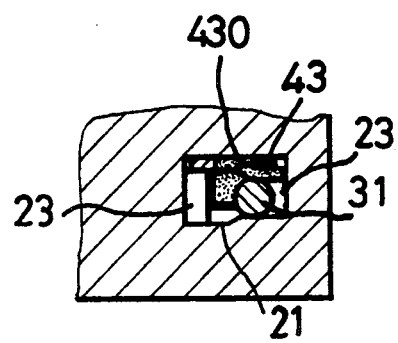
FIG. 7 is a view similar to FIG. 5 with an additional IC pin being firmly clamped between a contact portion of the conductive plate means and an inner periphery of the slot.

Referring to FIGS. 3 to 7, the conductive plate means 40 is firmly positioned in the slot 21 as will be described later. As previously mentioned, the left upper plate 41 and the right upper plate 42 are not coplanar, thus when the IC pin 31 is originally inserted into the slot 21, the IC pin 31 is such positioned that it is in loose contact with (or not in contact with) the left upper plate 41, after then, the IC pin 31 is further manually pulled by the cover 10 to firmly contact with the contact portion 43 of the right upper plate 42 as shown in FIG. 7. The slot 21 has two protrusions 23 formed in two opposite inner peripheries thereof for abutting against two side portions of the intersection portion 45 of the conductive plate means 40 preventing the latter from moving in the slot 21. The two protrusions 23 also block gaseous soldering flue from coating on the contact portion 43 of the conductive plate means 40. The conductive plate means 40 has at least a pair of sloping teeth 44 at two sides of the intersection portion 45. The pair of sloping teeth 44 taper downward therefore they are easily inserted into the slot 21 yet difficult to be pulled outward from the slot 21. It should be noted that the shoulder 46 of the conductive plate means 40 is positioned at an inner bottom of the slot 21 thus preventing the conductive plate means 40 from being moved downward when the corresponding IC pin 31 is inserted into the slot 21.

Particularly referring to FIG. 6, an IC pin 31 is being inserted into the slot 21. It should be noted that the two protrusions 23 will not block the passage of the IC pin 31 when the latter is inserted into the slot 21. The passage as mentioned is a passage which can pass the area between the two protrusions 23. After the IC pin 31 has been inserted into the slot 21, the cover 10 is manually pulled in a direction such that the IC pin 31 is moved to firmly contact the contact portion 43 of the right upper plate 42 through the guiding portion 430 of the right upper plate 42 as shown in FIG. 7.

Figure 8:
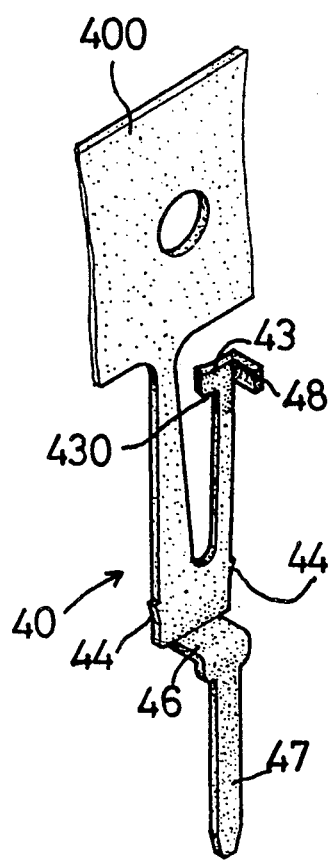
FIG. 8 is another embodiment of a conductive plate means of the present invention.
Figure 9:
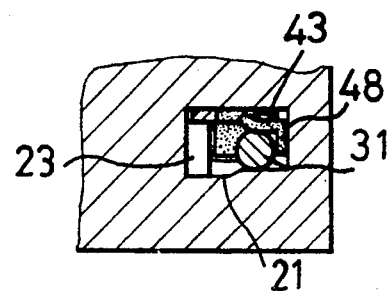
FIG. 9 is a view similar to FIG. 7, except that the conductive plate means has been replaced with the one shown in FIG. 8.
Figure 10:
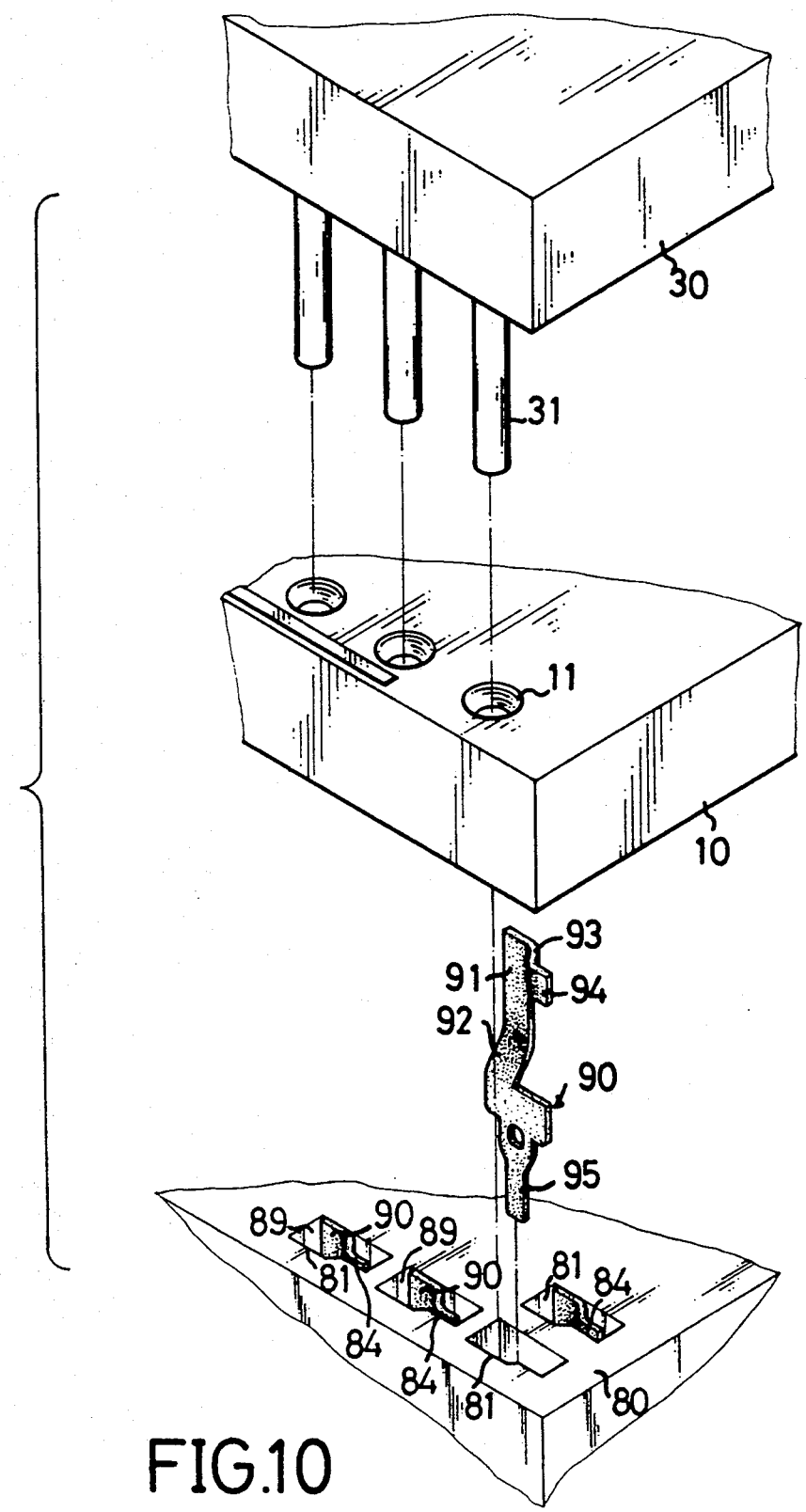
FIG. 10 is a partially exploded view of a conventional IC socket and an IC.

FIG. 8 illustrates another embodiment of the conductive plate means 40. In this embodiment, the conductive plate means 40 is similar to the previous embodiment as shown in FIG. 2, except that it has a positioning portion 48 perpendicularly extending from the contact portion 43. The positioning portion 48 abuts against an inner wall of the slot 21 thus enabling the conductive plate means 40 to be firmly positioned in the slot 21 as shown in FIG. 9.

I claim:

1. An IC socket comprising a cover slidably engaged to a base, said cover having a plurality of holes formed therethrough for receiving a corresponding number of IC pins, said base having a plurality of slots each of which corresponds to one of said holes of said cover and is retained in communication with said corresponding hole when said cover is manually slid on said base, and a plurality of conductive plate means each respectively positioned in a corresponding slot of said base, the improvement comprising:

each of said conductive plate means being substantially a fork comprising a first upper plate and a second upper plate, both intersected at a lower flat intersection portion thereof, a shoulder extended outwardly and substantially perpendicular to said flat intersection portion and bent downward as a lower plate, said second upper plate having a top portion curved and extended to said first upper plate thus forming a guiding portion, said first upper plate and said second upper plate being substantially flat and not co-planer, thus when said IC pins are originally inserted into said slots, said IC pins are in loose contact with said left upper plate, after then, said IC pins are further manually pulled by said cover to be in close contact with said top portion of said second upper plate;

two protrusions being formed in two opposite inner peripheries of each of said slots for abutting against two side portions of said intersection portion of each of said conductive plate means thereby preventing each of said conductive plate means from moving in said slot and for blocking gaseous soldering flue from coating the top portion of said second upper plate of said conductive plate means.

2. The IC socket as claimed in claim 1, wherein each of said conductive plate means has at least a pair of sloping teeth at two sides of said intersection portion, said sloping teeth tapering downward thus are easily inserted into said corresponding slot yet difficult to be pulled outward from said slot.

3. The IC socket as claimed in claim 1, wherein each of said conductive plate means has a positioning portion perpendicularly extending from said top portion and abutting against an inner wall of said corresponding slot thus enabling each of said conductive plate means to be firmly positioned in said slot.

* * * * *